(12) United States Patent
Hirano et al.

(10) Patent No.: US 6,420,743 B1
(45) Date of Patent: *Jul. 16, 2002

(54) SEMICONDUCTOR DEVICE

(75) Inventors: Hiroshige Hirano, Nara; Masato Takeo, Kyoto, both of (JP)

(73) Assignee: Matsushita Electronics, Corp., Kadoma (JP)

(*) Notice: Subject to any disclaimer, the term of this patent is extended or adjusted under 35 U.S.C. 154(b) by 40 days.

This patent is subject to a terminal disclaimer.

(21) Appl. No.: 09/637,723

(22) Filed: Aug. 11, 2000

Related U.S. Application Data

(62) Division of application No. 08/981,265, filed as application No. PCT/JP97/01347 on Apr. 18, 1997.

(30) Foreign Application Priority Data

Apr. 19, 1996 (JP) .............................. 8-98267

(51) Int. Cl.[7] .................. H01L 27/108; H01L 29/76; H01L 29/94; H01L 31/119
(52) U.S. Cl. ........................ 257/295; 257/306
(58) Field of Search .................. 257/295–310, 257/530–535; 438/243–254, 396–399

(56) References Cited

U.S. PATENT DOCUMENTS

| | | | |
|---|---|---|---|
| 5,355,277 A | 10/1994 | Hoshiba | |
| 5,508,881 A | 4/1996 | Stevens | |
| 5,519,235 A | 5/1996 | Ramesh | |
| 5,527,729 A | 6/1996 | Matsumoto et al. | |
| 5,548,475 A | 8/1996 | Ushikubo et al. | |
| 5,591,663 A | 1/1997 | Nasu et al. | |
| 5,599,424 A | 2/1997 | Matsumoto et al. | |
| 5,624,864 A | 4/1997 | Arita et al. | |
| 5,638,252 A | 6/1997 | Drab et al. | |
| 5,658,820 A | 8/1997 | Chang | |
| 5,716,875 A | 2/1998 | Jones et al. | |
| 5,760,432 A * | 6/1998 | Abe et al. ................... | 257/295 |
| 5,773,314 A | 6/1998 | Jiang et al. | |
| 5,804,823 A | 9/1998 | Ramer et al. | |
| 6,163,043 A * | 12/2000 | Hirano et al. ............... | 257/296 |

FOREIGN PATENT DOCUMENTS

| | | | |
|---|---|---|---|
| EP | 0 503 078 A1 | | 9/1992 |
| EP | 0 504 425 A1 | | 9/1992 |
| EP | 0 563 667 A2 | | 10/1993 |
| EP | 0 642 167 A2 | | 3/1995 |
| JP | 4-225510 | | 8/1992 |
| JP | 5-90489 | | 4/1993 |
| JP | 5-343616 | | 12/1993 |
| JP | 5-343697 | | 12/1993 |
| JP | 6-69418 | | 3/1994 |
| JP | 6-204404 | | 7/1994 |
| JP | 06069418 A | * | 9/1994 |
| JP | 6-244133 | | 9/1994 |
| JP | 7-50394 | | 2/1995 |
| JP | 7-226443 | | 8/1995 |
| JP | 7-235639 | | 9/1995 |
| JP | 7-263637 | | 10/1995 |
| JP | 8-17806 | | 1/1996 |

* cited by examiner

*Primary Examiner*—Steven Loke
*Assistant Examiner*—Cuong Quang Nguyen
(74) *Attorney, Agent, or Firm*—Burr & Brown

(57) ABSTRACT

Object: In a semiconductor device with ferroelectric capacitors, variations in the characteristics of the ferroelectric capacitors are reduced, and changes in the characteristic of the ferroelectric capacitor, i.e., characteristic deterioration with passage of time, is suppressed.

Measure to Solve: Lower electrodes 111a that extend along a first direction D1 and have a plan configuration having a second direction D2 perpendicular to the first direction as its width direction, a plurality of upper electrodes 112a that are disposed on the lower electrodes 111a opposite to the lower electrodes, and ferroelectric layers that are disposed between the electrodes constitute ferroelectric capacitors 110a, and a plan configuration of the upper electrode 112a is made a shape of the size in the first direction D1 being smaller than the size in the second direction D2.

2 Claims, 11 Drawing Sheets

SEMICONDUCTOR DEVICE

Cross Reference to Related Application

This is a divisional application of U.S. Ser. No. 08/981,265, filed Apr. 6, 1998, now allowed, which was the National Stage of International Application No. PCT/JP97/01347, filed Apr. 18, 1997, the entirety of which is incorporated herein by reference.

TECHNICAL ART

The present invention relates to a semiconductor device and, more particularly, to improvements in variations in characteristics and characteristic deterioration in a ferroelectric memory device.

BACKGROUND ART

As conventional semiconductor devices, there have been developed various circuits from relatively small-sized integrated circuits mounting, for example, an amplifier circuit, an oscillating circuit, a power supply circuit and the like, to relatively large-sized integrated circuits, such as a microprocessor and a memory device. Especially in recent years, as a kind of non-volatile memory device, a ferroelectric memory device with ferroelectric capacitors as capacitors constituting memory cells has been contrived.

The ferroelectric capacitor consists of a pair of electrodes opposite to each other, and a dielectric layer comprising a ferroelectric material and sandwiched between both electrodes, and has the hysteresis characteristic as a relationship between a voltage applied between the both electrodes and polarizability of the ferroelectric material. That is, the ferroelectric capacitor has a construction in which even when the electric field (applied voltage) is zero, a remaining polarization of a polarity in accordance with the hysteresis of voltage application remains in the ferroelectric layer, and in the ferroelectric memory device non-volatility of the storage data is realized by representing storage data by the remaining polarization of the ferroelectric capacitor.

In a non-volatile memory device using such ferroelectric capacitors, it is an important objective to reduce variations in the hysteresis characteristics of the ferroelectric capacitors and reduce changes in the hysteresis characteristic accompanying the use.

More specifically, FIGS. 14 to 16 are diagrams for explaining a conventional ferroelectric memory device, FIG. 14 is a plan view illustrating a memory cell array in the ferroelectric memory device, FIG. 15 is a cross-sectional view along a line XV—XV portion in FIG. 14, and FIG. 16 is a plan view illustrating a position relation between upper electrodes and a lower electrode of ferroelectric capacitors.

In the figures, reference numeral 200 designates a memory cell array constituting a ferroelectric memory device, a plurality of transistor regions 220a are arranged on a silicon substrate 201 in a first direction D1, and an insulating film 202 for element isolation is formed on a portion of the silicon substrate 201, except the transistor regions 220a.

On both sides of the transistor regions 220a in a line along the first direction D1, lower electrodes (first electrodes) 211 are formed as cell plate electrodes on the insulating film 202 for element isolation via first interlayer insulating films 203. The lower electrode 211 comprises a metallic material, such as titanium and platinum, and has a stripe-shaped plan configuration extending along the first direction D1. On surfaces of the lower electrodes 211, ferroelectric layers 213 are formed.

On the ferroelectric layers 213 on the surfaces of the lower electrodes 211, upper electrodes (second electrodes) 212 comprising a metallic material, such as titanium and platinum, are formed corresponding to the respective transistor regions 220a. That is, on the ferroelectric layers 213, the plurality of upper electrodes 212 are arranged along the first direction D1. A plan shape of each upper electrode 212 is a rectangular shape having the first direction D1 as its longitudinal direction, and as is known from FIG. 14, the area of each upper electrode 212 is smaller than that of the lower electrode 211. Here, ferroelectric capacitors 210 are constituted by the lower electrode 211, the upper electrodes 212, and the ferroelectric layer 213 located between these electrodes, and the surfaces of the ferroelectric layers 213 and the surfaces of the upper electrodes 211 are covered with second interlayer insulating films 204.

In this case, the upper electrode 212 is disposed in a center portion of the lower electrode 211, and the distance $O_{11}$ (hereinafter referred to as non-overlap width) between a side $211a_1$ of the lower electrode 211 and a side $211a_1$ of the upper electrode 211 opposite thereto is made equal to the distance $O_{12}$ (hereinafter referred to as non-overlap width) between the other side $211a_2$ of the lower electrode 211 and a side $211a_2$ of the upper electrode 211 opposite thereto.

Between the pair of lower electrodes 211 that sandwich the transistor regions 220a opposing to each other, a pair of word lines (second wirings) 223a and 223b comprising polysilicon are disposed so as to straddle over the plurality of transistor regions 220a arranged in a line. A source diffusion region 222 and drain diffusion regions 221 of a memory transistor 220 constituting a memory cell are formed on both sides of the word lines 223a and 223b in each transistor region 220a. Portions of the word lines 223a and 223b located above each transistor region 220a constitute gate electrodes of the memory transistor 220, and are located on the substrate surface via gate insulating films 202a. The surfaces of the diffusion regions 221 and 222 and the word lines 223a and 223b are covered with the first and second interlayer insulating films 203 and 204. In FIG. 14, these interlayer insulating films are not shown.

The source diffusion region 222 located between the pair of word lines 223a and 223b in each transistor region 220a is connected to a bit line 233b extending along a second direction D2 perpendicular to the first direction D1, through a contact hole 205b formed in the first and second interlayer insulating films 203 and 204. The drain diffusion regions 221 located outside the opposite word lines 223a and 223b in each transistor region 220a are electrically connected to the upper electrodes 212 by connecting wirings 233a. That is, one end of the connecting wiring 233a is connected to the upper electrode 212 through a contact hole 204a formed in the second interlayer insulating film 204, and the other end of the connecting wiring 233a is connected to the drain diffusion region 221 through a contact hole 205a formed in the first and second interlayer insulating films 203 and 204.

The lower electrodes 211 and the ferroelectric layers 213 are formed by successively forming films of a metallic material, such as titanium and platinum, and a ferroelectric material on the interlayer insulating film 203 and patterning these films, and the upper electrodes 212 are formed by forming a film of a metallic material, such as titanium and platinum, on the ferroelectric layer 213 and patterning the film. The bit lines 233b and the connecting wirings 233a are formed by patterning a metallic film, such as aluminum, formed on the interlayer insulating film 204. The word lines 223a and 223b are formed by patterning a polysilicon film that is formed on the gate insulating films 202a and the insulating film 202 for element isolation.

The first interlayer insulating film 203 comprises an insulating material, such as NSG (oxide silicon based) and BPSG (boron, phosphine doped oxide silicon), and the second interlayer insulating film 204 comprises, for example, PSG (phosphine doped oxide silicon).

As the ferroelectric material composing the ferroelectric layer 213 of the ferroelectric capacitors, $KNO_3$, $PbLa_2O_3$-$ZrO_2$-$TiO_2$, $PbTiO_3$-$PbZrO_3$ or the like has been known. In addition, PCT International Publication WO 93/12542 discloses a ferroelectric material that has extremely low fatigueness as compared with $PbTiO_3$-$PbZrO_3$, being suitable for a ferroelectric memory device.

The operation will be described briefly.

In the ferroelectric memory device with the construction as described above, when, for example, the word line 223a is selected and subsequently, one of the lower electrodes 211 (for example, the uppermost lower electrode shown in FIG. 14) is driven, thereby making the voltage level thereof the level corresponding to the logical voltage "H", storage data of the ferroelectric capacitors 210 formed on this lower electrode are read out onto the respective bit lines 233b through the connecting wirings 233a and the transistors 220.

A brief description is given of the principle of this reading out operation. FIG. 17 is a graph showing the hysteresis characteristic of the ferroelectric capacitor, in which the ordinate represents the polarization charge amount P of the ferroelectric capacitor and the abscissa represents the electric field E applied to the ferroelectric capacitor. $P_1$ and $P_2$ show the polarization charge amounts that are generated when the electric fields $E_1$ and $E_2$ (=$-E_1$) are applied to the ferroelectric capacitor, respectively, $P_{r1}$ shows the residual charge amount against the applied voltage $E_1$, $P_{r2}$ shows the residual charge amount against the applied voltage $E_2$ (=$-E_1$), $E_{c1}$ shows the counter electric field against the residual charge amount $P_{r2}$, and $E_{c2}$ shows the counter electric field against the residual charge amount $P_{r1}$. In this ferroelectric memory device, the reading out voltage that is applied to the ferroelectric capacitor at reading out of data (that is, the voltage applied to the lower electrode) is set to a voltage that makes the electric field applied to the ferroelectric capacitor, $E_2$.

In the ferroelectric memory device, predetermined storage data are written into the respective memory cells, and the residual charge amount of the ferroelectric capacitor constituting the memory cell corresponds to the residual charge amount $P_{r1}$ or $P_{r2}$ corresponding to the storage data "1" or "0", respectively. In this state, when a predetermined word line is driven and the reading out voltage is applied to a predetermined lower electrode of ferroelectric capacitors, the electric charge corresponding to the residual charge amount $P_{r1}$ or $P_{r2}$ is read out from each ferroelectric capacitor that is positioned on the predetermined lower electrode onto the bit line.

For example, the difference $\Delta P_2$ (=$P_{r2}-P_2$) between the polarization charge amount $P_2$ corresponding to the applied voltage $E_2$ and the residual charge amount $P_{r2}$ is read out from the ferroelectric capacitor having the residual charge amount $P_{r2}$ as signal charges corresponding to the storage data onto the bit line 233b. Further, the difference $\Delta P_1$ (=$P_{r1}-P_2$) between the polarization charge amount $P_2$ corresponding to the applied voltage $E_2$ and the residual charge amount $P_{r1}$ is read out from the ferroelectric capacitor having the residual charge amount $P_{r1}$ as signal charges corresponding to the storage data onto the bit line. In this case, since the charge amount ($P_{r1}-P_2$) and the charge amount ($P_{r2}-P_2$) that are read out onto the bit lines are different from each other, it is possible to discriminate the data that are stored in the memory cells due to the difference in the charge amount. In addition, in the construction in which the data are read out from the ferroelectric capacitors as described above, as for the memory cell in which the residual charge amount of the ferroelectric capacitor is the residual charge amount $P_{r1}$, data destruction occurs by the reading out operation. For this reason, the ferroelectric memory device has a circuit construction in which after reading out of data, the storage data before reading out is written into each ferroelectric capacitor to modify the data of the memory cell.

Then, the signal charges corresponding to the storage data that are read out onto the respective bit lines 233b are amplified by sense amplifiers (not shown) to be output to the outside of the ferroelectric memory device. Thereafter, the voltage level of the lower electrode 211 is made a level corresponding to the logical voltage "L" to make the word line 223a the unselected state, thereby completing the reading out.

In the conventional ferroelectric capacitors 210, however, variations in the characteristics, i.e., variations in polarizability of the ferroelectric layers, are large, and changes in the characteristic, i.e., changes in polarizability with passage of time are likely to occur.

More specifically, the initial values of the polarization charge amounts $P_1$ and $P_2$, the counter electric fields $E_{c1}$ and $E_{c2}$, or the residual charge amounts $P_{r1}$ and $P_{r2}$ against the applied fields $E_1$ and $E_2$ in the hysteresis characteristic curves of the ferroelectric capacitor shown in FIG. 17 widely vary between the memory cells in one device (ferroelectric memory device) or between the devices, and changes in the hysteresis characteristic with passage of time (change from normal characteristic shown by curves La to deteriorated characteristic shown by curves Lb) are likely to occur in a short time.

The present invention is directed to solving the above-described problems, and has an object to provide a semiconductor device with large longevity and a good fabrication yield, in which variations in characteristics of ferroelectric capacitors can be suppressed and characteristic changes with passage of time can be reduced.

DISCLOSURE OF THE INVENTION

A semiconductor device according to the present invention includes a first electrode extending along a first direction and having a plan configuration having a second direction perpendicular to the first direction as its width direction; second electrodes disposed opposite to the first electrode and having a plan configuration of the size in the first direction and the size in the second direction being equal to each other, or a plan configuration of the size in the first direction being shorter than the size in the second direction; and a ferroelectric layer disposed between the first electrode and the second electrodes; the first and second electrodes and the ferroelectric layer between the both electrodes constituting ferroelectric capacitors. in preferably the second electrodes are formed by patterning a predetermined conductive material layer, the plurality of second electrodes are arranged along the first direction, and the arrangement intervals between the adjacent second electrodes are set to be the minimum size of an opening pattern that can be formed on the conductive material layer. in more preferably a plan configuration of the second electrode is a polygonal configuration, and all the sizes of respective angles in the plan configuration of the second electrode are larger than 90°.

In another embodiment, the device includes first electrodes extending along a first direction and having a plan configuration having a second direction perpendicular to the first direction as its width direction; a plurality of second electrodes positioned opposite to the first electrodes and arranged in the form of a matrix along the first direction and the second direction; and ferroelectric layers disposed between the first electrodes and the second electrodes; the first electrodes, the ferroelectric layers, and the plurality of second electrodes constituting a plurality of ferroelectric capacitors.

Preferably, the second electrodes have a plan configuration of the size in the first direction and the size in the second direction being equal to each other, or a plan configuration of the size in the first direction being shorter than the size in the second direction.

In another embodiment, the device includes a first electrode extending along a first direction and having a plan configuration having a second direction perpendicular to the first direction as its width direction; second electrodes disposed opposite to the first electrode and having a plan configuration having a direction between the first direction and the second direction as its longitudinal direction; and a ferroelectric layer disposed between the first electrode and the second electrodes; the first and second electrodes and the ferroelectric layer between the both electrodes constituting ferroelectric capacitors.

Preferably a plan configuration of the second electrode is a polygonal configuration, and all the sizes of respective interior angles in the plan configuration of the second electrode are larger than 90°.

In another embodiment, the device includes a first electrode extending along a first direction and having a plan configuration having a second direction perpendicular to the first direction as its width direction; second electrodes disposed opposite to the first electrode and having a first side that is closest and opposite to a first side of the first electrode parallel to the first direction, and a second side that is closest and opposite to a second side of the first electrode parallel to the first direction; and a ferroelectric layer disposed between the first electrode and the second electrodes; the first and second electrodes and, the ferroelectric layer between the both electrodes constituting ferroelectric capacitors; and the length of the first side of the second electrode being larger than the length of the second side thereof, and the distance between the first side of the second electrode and the first side of the first electrode being longer than the distance between the second side of the second electrode and the second side of the first electrode.

Preferably a plan configuration of the second electrode is a polygonal configuration, and all the sizes of respective interior angles in the plan configuration of the second electrode are larger than 90°.

In another embodiment, the device constitutes a ferroelectric memory device with a plurality of memory cells respectively comprising ferroelectric capacitors and memory transistors and arranged in the form of a matrix, cell plate lines for driving the ferroelectric capacitors, a plurality of bit lines corresponding to respective memory cell columns, a plurality of word lines corresponding to respective memory cell rows, for selecting the memory transistors, and sense amplifiers connected to the respective bit lines and amplifying data signals on the predetermined bit lines. This ferroelectric memory device includes first electrodes extending along a first direction, having a plan configuration having a second direction perpendicular to the first direction as its width direction, and connected to the cell plate lines; second electrodes disposed opposite to the first electrodes and having a plan configuration of the size in the first direction and the size in the second direction being equal to each other, or a plan configuration of the size in the first direction being shorter than the size in the second direction; and ferroelectric layers disposed between the first electrodes and the second electrodes; the first and second electrodes and the ferroelectric layers constituting the ferroelectric capacitors.

Preferably, the device includes a first electrode constituting the ferroelectric capacitors extending along a first direction and having a plan configuration having a second direction perpendicular to the first direction as its width direction; second electrodes constituting the ferroelectric capacitors disposed opposite to the first electrode; a ferroelectric layer constituting the ferroelectric capacitors disposed between the first electrode and the second electrodes; an insulating film formed to cover the surfaces of the second electrodes and having contact holes formed on positions of the surfaces of the second electrodes that are shifted from the center positions to one side of the first electrode along the first direction; and wirings formed on the insulating film and connected to the second electrodes through the contact holes.

Alternatively, the device includes a first electrode constituting the ferroelectric capacitors extending along a first direction and having a plan configuration having a second direction perpendicular to the first direction as its width direction; second electrodes constituting the ferroelectric capacitors disposed opposite to the first electrode; a ferroelectric layer constituting the ferroelectric capacitors disposed between the first electrode and the second electrodes; an insulating film formed to cover the surfaces of the second electrodes and having contact holes formed on predetermined positions of the surfaces of the second electrodes; and wirings formed on the insulating film and electrically connected to the second electrodes; the second electrodes having a structure in which the whole is divided into plural electrode portions by forming notches at predetermined sides; and the wirings being connected to parts of the plural electrode portions constituting the second electrodes through the contact holes.

BRIEF DESCRIPTION OF THE DRAWINGS

FIG. 10(a) is a diagram illustrating a position relation between a lower electrode and upper electrodes of ferroelectric capacitors constituting the ferroelectric memory device, FIG. 10(b) is a diagram for explaining a configuration of the upper electrode according to the sixth embodiment of the invention, and FIG. 10(c) is a diagram illustrating the configuration of the upper electrode according to the sixth embodiment of the invention.

BEST EMBODIMENTS FOR CARRYING OUT THE INVENTION

Initially, a description is given of the aiming point and fundamental principle of the present invention.

As a result of earnest study to achieve the above-described object, the inventors of the present invention found that the variations in characteristics and the characteristic changes of ferroelectric capacitors were based on deterioration of material quality of the ferroelectric layers due to various processes after the ferroelectric layers constituting the ferroelectric capacitors are formed.

In other words, since the lower electrodes and the ferroelectric layers are formed by forming a metallic film such as platinum and a ferroelectric film on the interlayer insulating film and patterning these films, when the patterning is performed, etchant or the like intrudes from the side surfaces of the ferroelectric layer that are exposed by etching processing as impurities, thereby causing material quality deterioration at the side portions of the ferroelectric layer. In addition, since the interface between the ferroelectric layer and the lower electrode is exposed at the etching, a resistance layer or the like is formed at the interface portion by intrusion of impurities.

Further, since the upper electrodes are formed by patterning a metallic film such as platinum formed on the ferroelectric layer, when the patterning is performed, portions of the ferroelectric layer exposed by removal of the metallic film are subjected to etching processing, thereby causing material quality deterioration of the ferroelectric layer at the periphery of the upper electrodes.

Furthermore, when the contact holes are formed by selectively removing portions of the interlayer insulating film on the upper electrodes, impurities intrude into the ferroelectric layer through the upper electrodes exposed in the contact holes, and further when the connecting wirings are formed, titanium or the like serving as a constitutional material of the connecting wirings intrudes into the ferroelectric layer through the upper electrodes. Thereby, material quality deterioration occurs at portions of the ferroelectric layer corresponding to the contact holes.

Figure 16:
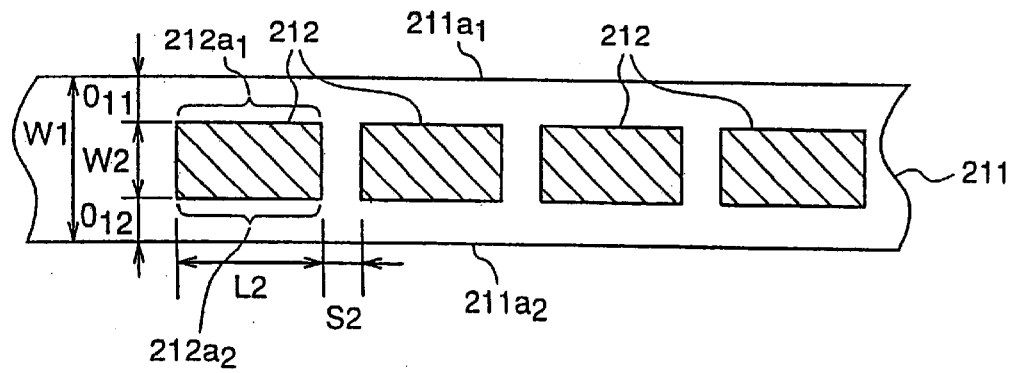
FIG. 16 is a plan view illustrating a position relation between a lower electrode and upper electrodes of ferroelectric capacitors in the conventional ferroelectric memory device.
Figure 17:
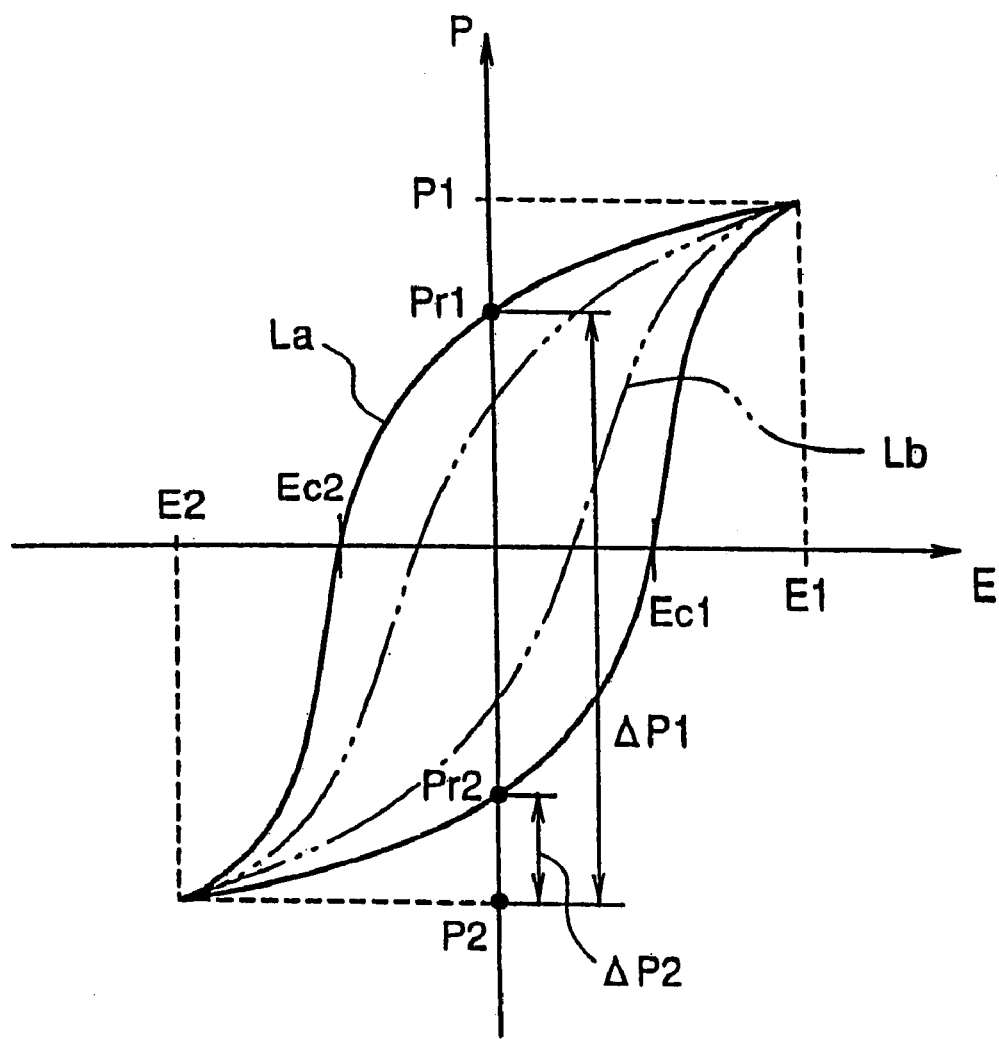
FIG. 17 is a graph showing the hysteresis characteristic of the ferroelectric capacitor.

From these facts, the width size of the lower electrode in a direction perpendicular to a longitudinal direction is widened and the upper electrodes are arranged as distantly as possible from the side portions of the lower electrode, as well as the areas of the upper electrodes are increased, whereby the influences by the portions deteriorated due to impurity diffusion, of the ferroelectric layer in the ferroelectric capacitors can be reduced, while when the sizes of the lower electrode and the upper electrodes are simply increased, for example, the non-overlap widths $O_{11}$ and $O_{12}$ shown in FIG. 16 are made larger than the width $W_2$ of the upper electrode 212, the width $W_1$ of the lower electrode 211 becomes larger than $(W_2+O_{11}+O_{12})$, so that the layout area on the substrate of the memory cell array is eminently increased, resulting in a new problem.

Therefore, the inventors of the present invention further found the relevancy between the configurations of the upper electrodes constituting the ferroelectric capacitors and such as the characteristic variations, and the relevancy between the positions of the contact holes on the upper electrodes and such as the characteristic variations, and developed a device that can avoid the occurrence of the above-described new problem on the basis of these.

More specifically, the inventors of the present invention noticed that because the length $L_2$ of the upper electrode 212 was larger than its width $W_2$ in the conventional ferroelectric capacitor 210, the ferroelectric capacitors were greatly affected by the portions having the material quality deterioration at the sides of the ferroelectric layer, thereby making it likely to cause the characteristic variations and characteristic changes of the ferroelectric capacitors, and found that the portions causing the material quality deterioration, of the ferroelectric layer constituting the ferroelectric capacitors were mainly portions that are positioned in the vicinity of the sides of the lower electrode, and by making the plan configurations of the upper electrodes the configurations having the width direction of the lower electrode as its longitudinal direction, the portions having the material quality deterioration, of the ferroelectric layer, included in the ferroelectric capacitors could be reduced without reducing the areas of the upper electrodes.

Further, they found by arranging the contact holes of the upper electrodes at positions shifted from the center positions of the upper electrodes toward the side of the lower electrode, diffusion of impurities from the contact holes to the ferroelectric layer through the upper electrodes can be suppressed.

A description is given of respective embodiments of the present invention on the basis of such aiming point and fundamental principle.

Embodiment 1

Figure 1:
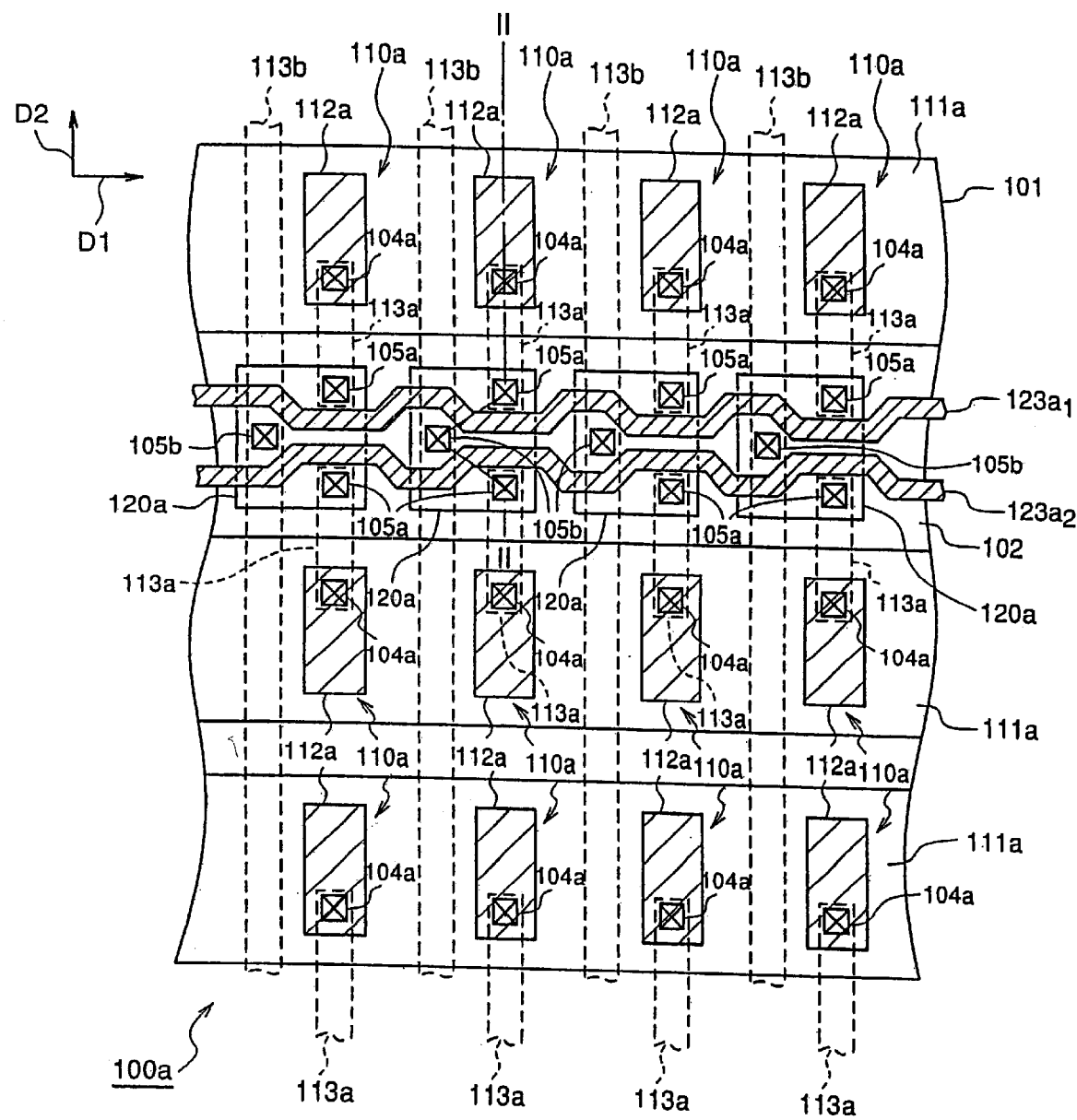
FIG. 1 is a plan view illustrating a memory cell array of a ferroelectric memory device in accordance with a first embodiment of the present invention.
Figure 2:
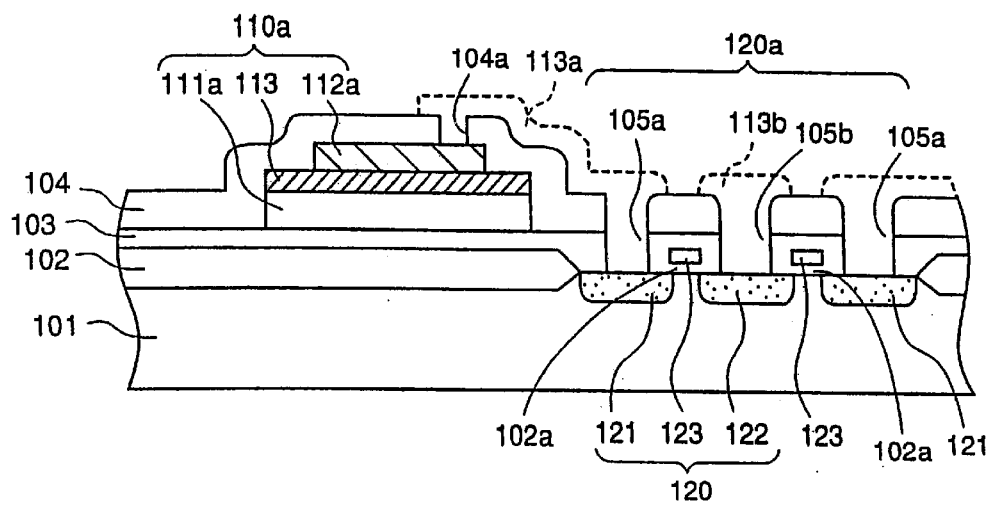
FIG. 2 is a cross-sectional view along a line II—II portion in FIG. 1.
Figure 3:
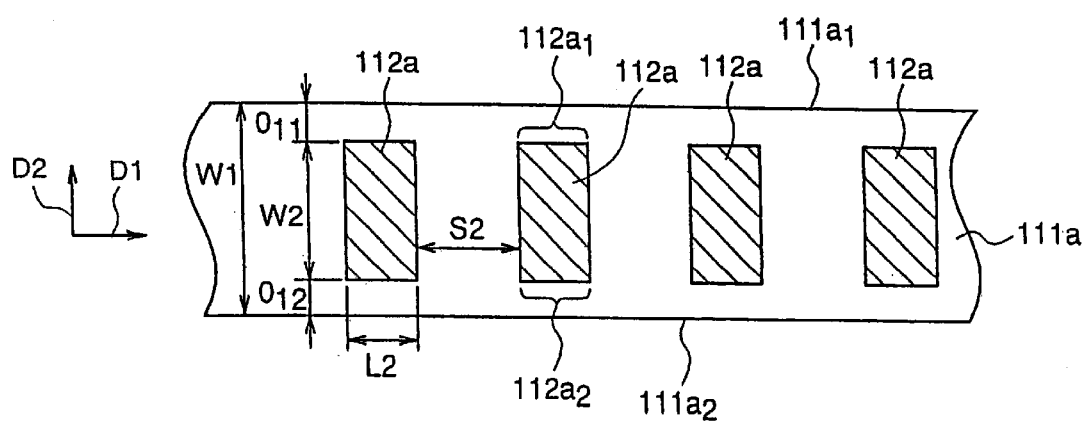
FIG. 3 is a plan view illustrating a position relation between a lower electrode and upper electrodes constituting ferroelectric capacitors according to the first

FIGS. 1 to 3 are diagrams for explaining a ferroelectric memory device according to a first embodiment of the present invention, FIG. 1 is a plan view illustrating a part of a memory cell array constituting the ferroelectric memory device, FIG. 2 is a cross-sectional view along a line II—II portion in FIG. 1, and FIG. 3 is a plan view illustrating a position relation between upper electrodes and a lower electrode of ferroelectric capacitors constituting memory cells.

In the figures, reference numeral 100a designates a memory cell array constituting a ferroelectric memory device, transistor regions 120a are arranged on a silicon substrate 101 in the form of a matrix along a first direction D1 and a second direction D2 perpendicular to the first direction, and an insulating film 102 for element isolation is formed on a surface region of the silicon substrate 101, except the transistor regions.

On both sides of the transistor regions 120a of each line along the first direction D1, lower electrodes (first electrodes) 111a are disposed as cell plate electrodes. The lower electrodes 111a are formed by patterning a metallic film, such as titanium and platinum, and disposed on the insulating film 102 for element isolation via interlayer insulating films 103. Further, the lower electrodes 111a extend along the first direction D1, and have stripe-shaped plans having the second direction perpendicular to the first direction as its wiring width direction, and ferroelectric layers 113 are formed on surfaces of the lower electrodes.

On the ferroelectric layers 113 on the surfaces of the respective lower electrodes 111a, upper electrodes (second electrodes) 112a are formed by patterning a metallic film, such as platinum. That is, on the ferroelectric layers 113 on the respective lower electrodes 111a, the plurality of upper electrodes 112a are arranged along the first direction D1. A plan shape of each upper electrode 112a is a rectangular shape having the second direction D2 as its longitudinal direction, and the area of each upper electrode 112a is smaller than that of the lower electrode 111a. The surfaces of the ferroelectric layers 113 and the surfaces of the upper electrodes 112a are covered with second interlayer insulating films 104. In FIG. 1, the ferroelectric layers 113 and the first and second interlayer insulating films 103 and 104 are not shown.

At this time, the lower electrode 111a, the upper electrodes 112a that are located above the lower electrode, and the ferroelectric layer 113 between the lower electrode and the upper electrodes constitute ferroelectric capacitors 110a. The ferroelectric capacitors 110a are disposed on both sides of the transistor regions 120a.

Between both of the lower electrodes 111a that sandwich the transistor regions 120a opposing to each other, a pair of word lines $123a_1$ and $123a_2$ comprising polysilicon is disposed so as to straddle over the plurality of transistor regions 120a arranged in a line. In this case, the word lines $123a_1$ and $123a_2$ have zigzag-shaped plans so that they do not overlap with positions where contact holes 105a and 105b are formed in the transistor regions 120a. A source diffusion region 122 and drain diffusion regions 121 of a transistor constituting a memory cell are formed on both sides of the word lines in each transistor region. Portions of the word lines located above each transistor region constitute gates of the transistor, and are located on the surface region of the substrate 101 via gate insulating films 102a. The surfaces of the diffusion regions 121 and 122 and the word lines $123a_1$ and $123a_2$ are covered with the first and second interlayer insulating films 103 and 104.

The source diffusion region 122 located inside the pair of word lines at each transistor region 120a is connected to a bit line 113b extending along the second direction perpendicular to the first direction D1, through a contact hole 105b that is formed in the first and second interlayer insulating films 103 and 104. The drain diffusion regions 121 located outside the pair of word lines at each transistor region 120a are electrically connected to the upper electrodes 112a of the ferroelectric capacitors 110a corresponding to each transistor region 120a by connecting wirings 113a. That is, one end of the connecting wiring 113a is connected to the upper electrode 112a through a contact hole 104a that is formed in the second interlayer insulating film 104, and the other end of the connecting wiring 113a is connected to the drain diffusion region 121 through a contact hole 105a that is formed in the first and second interlayer insulating films 103 and 104.

In this case, the first interlayer insulating film 103 comprises an insulating material, such as NSG (oxide silicon based) and BPSG (boron, phosphine doped oxide silicon), and the second interlayer insulating film 104 comprises an insulating material, for example, PSG (phosphine doped oxide silicon).

As a ferroelectric material of the ferroelectric layer 113 of the ferroelectric capacitors 110a, $KNO_3$, $PbLa_2O_3$-$ZrO_2$-$TiO_2$, $PCTiO_3$-$PbZrO_3$ or the like has been known. In addition, PCT International Publication WO 93/12542 discloses a ferroelectric material that has extremely low fatigueness as compared with $PbTiO_3$-$PbZrO_3$, being suitable for a ferroelectric memory device.

The connecting wirings 113a and the bit lines 113b are formed by patterning a titanium layer and an aluminum layer that are successively formed on the substrate. In addition, the connecting wirings 113a and the bit lines 113b may be have a single-layer structure comprising an aluminum layer. In this case, they may be formed by patterning the identical aluminum layer, or may be formed by patterning different aluminum layers.

In the first embodiment of the invention, especially as shown in FIG. 3, the plan configuration of the upper electrode 112a is made a plan configuration of the size $L_2$ in the first direction D1 being smaller than the size $W_2$ in the second direction D2. The area of the upper electrode 112a that is disposed opposite to the lower electrode 111a is smaller than the area of the lower electrode 111a. In this case, the distance $O_{11}$ (hereinafter referred to as first non-overlap width) between a first side $111a_1$ of the lower electrode 111a and a first side $112a_1$ of the upper electrode 112a opposite thereto is made equal to the distance $O_{12}$ (hereinafter referred to as second non-overlap width) between a first side $111a_2$ of the lower electrode 111a and a first side $112a_2$ of the upper electrode 112a opposite thereto, and these first and second non-overlap widths $O_{11}$ and $O_{12}$ are set to be smaller than the size $W_2$ of the upper electrode 112a in the second direction D2 (width direction of the lower electrode).

A function and effects will be described.

The data reading out operation in the ferroelectric memory device according to the first embodiment is identical as the operation in the conventional ferroelectric memory device.

In the first embodiment of the invention, in the ferroelectric memory device, since the plurality of upper electrodes 112a are arranged on the lower electrode (cell plate electrode) 111a having a stripe-shaped plan configuration via the ferroelectric layer 113, along a longitudinal direction of the lower electrode 111a, thereby constituting the plurality of ferroelectric capacitors 110a, and the size $L_2$ of the upper electrode 112a in the longitudinal direction of the lower electrode is smaller than the size $W_2$ in the direction perpendicular to the size $L_2$, regions of the upper electrodes 112a that are piled up to side portions of the ferroelectric layer 113 at which material quality deterioration is caused can be reduced without reducing the areas of the upper electrodes 112a. Consequently, variations in characteristics as the whole of the ferroelectric capacitors are reduced, and characteristic changes with passage of time are moderated.

In this case, since the width $L_2$ of the region of the upper electrode 112a that is affected by the material quality deterioration of the ferroelectric layer is small, even when the non-overlap widths $O_{11}$ and $O_{12}$ are made smaller, the variations in characteristics as the whole of the ferroelectric capacitors and the characteristic changes can be suppressed, whereby the width $W_1$ $(=W_2+O_{11}+O_{12})$ of the lower electrode 111a can be made smaller, thereby reducing the layout area of the memory cell array.

Further, in the first embodiment, since the contact holes 104a formed on the upper electrodes 112a are arranged at positions of the upper electrodes 112a that are shifted from the center positions to one side, the material quality deterioration of the ferroelectric layer 113 due to the impurity diffusion from the contact holes can be prevented from spreading over portions corresponding to the center of the upper electrodes 112a.

More specifically, when the contact holes 104a are formed and the connecting wirings 113a are formed, impurities intrude into the ferroelectric layer 113 through the upper electrodes 112a that are exposed in the contact holes 104a, thereby deteriorating the material of the ferroelectric layer 113. This material quality deterioration causes variations in characteristics of the ferroelectric capacitors and characteristic deterioration, and if the material quality deterioration is caused at portions corresponding to the center of the upper electrodes 112a, it combines with the deterioration that is caused at the sides of the lower electrode 111a, so that the material quality deterioration of the ferroelectric layer spreads over an extremely wide range of the ferroelectric layer.

Meanwhile, as in the first embodiment of the invention, in the ferroelectric capacitors in which the contact holes 104a formed on the upper electrodes 112a are arranged at positions of the upper electrodes 112a that are shifted from the center positions to one side, regions of the ferroelectric layer 113 at which the material quality deterioration is caused by diffusion of impurities from the contact holes 104a can overlap with regions at the sides of the lower electrode 111a at which the material quality deterioration is caused, thereby keeping wide regions of the ferroelectric layer 113 at which no deterioration of material quality is caused. Consequently, variations in characteristics as the ferroelectric capacitors and characteristic deterioration can be effectively suppressed.

In addition, in the first embodiment, although there is described the case in which the width $W_2$ of the upper electrode 112a (size in the second direction D2) is smaller than its length $L_2$ (size in the first direction D1), the width $W_2$ and the length $L_2$ of the upper electrode 112a may be the identical size. Also in this case, it is possible to suppress the variations in characteristics as the whole of the ferroelectric capacitors and the characteristic changes.

Embodiment 2

Figure 4:
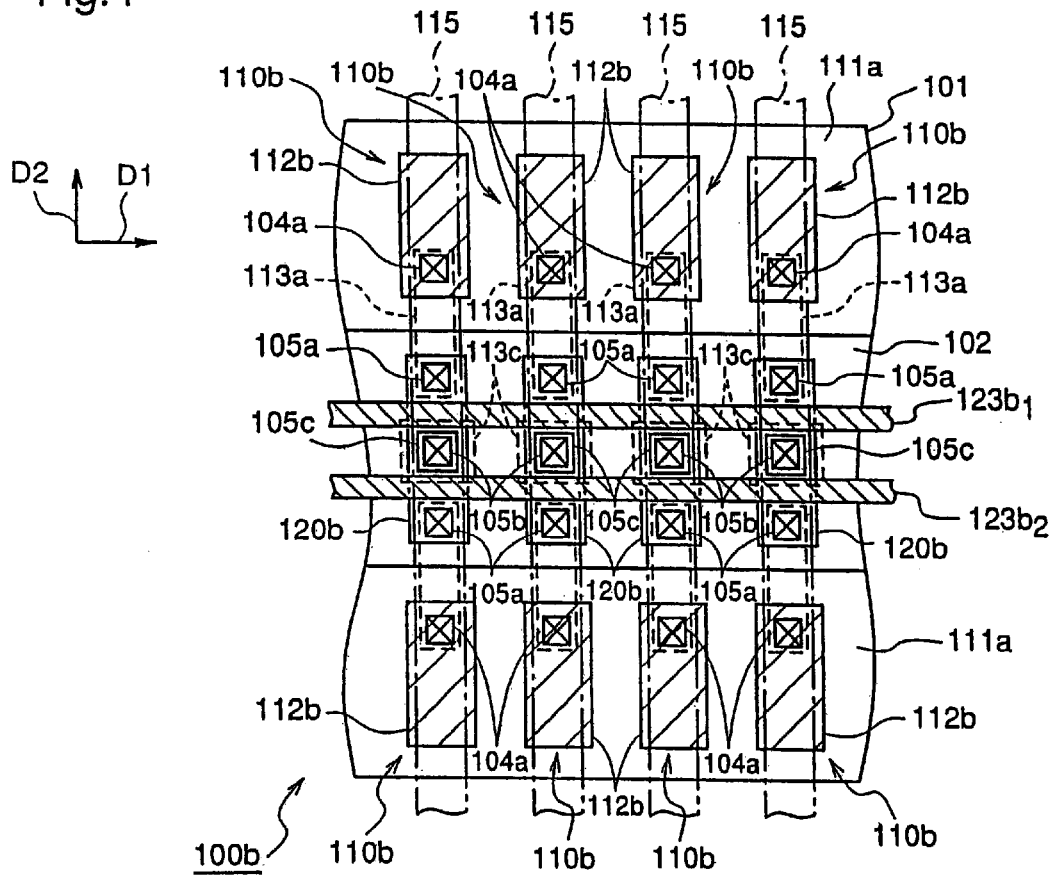
FIG. 4 is a plan view illustrating a memory cell array of a ferroelectric memory device in accordance with a second embodiment of the present invention.
Figure 5:
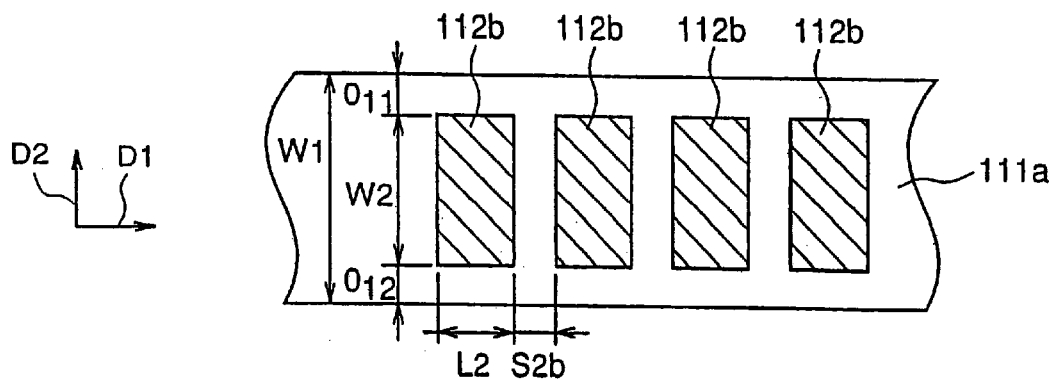
FIG. 5 is a plan view illustrating a position relation between a lower electrode and upper electrodes constituting ferroelectric capacitors according to the second embodiment of the invention.

FIGS. 4 and 5 are diagrams for explaining a ferroelectric memory device according to a second embodiment of the present invention, FIG. 4 is a plan view illustrating a memory cell array constituting the ferroelectric memory device, and FIG. 5 is a plan view illustrating a position relation between upper electrodes and a lower electrode constituting ferroelectric capacitors in the memory cell array.

In a memory cell array of a ferroelectric memory device according to the second embodiment, the arrangement intervals between the adjacent upper electrodes in the first embodiment are set to be the minimum size (minimum process size) $S_{2b}$ of an opening pattern that can be formed on a conductive material layer constituting the upper electrodes, and the arrangement of the respective contact holes at the transistor regions in the first embodiment is changed according to this minimum size.

More specifically, in FIGS. 4 and 5, the same reference numerals as those shown in FIGS. 1 to 3 designate the same parts as in the first embodiment, and numeral 100b designates a memory cell array constituting a ferroelectric memory device. In this memory cell array 100b, transistor regions 120b are arranged on the silicon substrate 101 in the form of a matrix along a first direction D1 and a second direction D2 perpendicular to the first direction, and the insulating film 102 for element isolation is formed on a surface region of the silicon substrate 101, except the transistor regions. On both sides of the transistor regions 120b of each line along the first direction D1, the lower electrodes (first electrodes) 111a on which the ferroelectric layers 113 are formed as in the first embodiment are disposed as cell plate electrodes.

On the ferroelectric layers 113 on the surfaces of the respective lower electrodes 111a, a plurality of upper electrodes (second electrodes) 112b that are formed by patterning a metallic film, such as platinum, are arranged along the first direction D1. At this time, the arrangement intervals of the adjacent upper electrodes 112b are set to be the minimum process size $S_{2b}$. A plan shape of each upper electrode 112b is a rectangular shape having the second direction D2 as its longitudinal direction as in the first embodiment, and the area of each upper electrode 112b is smaller than that of the lower electrode 111a. At this time, the lower electrode 111a, the plurality of upper electrodes 112b that are located above the lower electrode, and the ferroelectric layer 113 between the lower electrode and the upper electrodes constitute a plurality of ferroelectric capacitors 110b. The ferroelectric capacitors 110b are disposed on both sides of the transistor regions 120b.

Between both of the lower electrodes 111a that sandwich the transistor regions 110b opposing to each other, a pair of word lines $123b_1$ and $123b_2$ comprising polysilicon is disposed so as to straddle over the plurality of transistor regions 120b arranged in a line. In this case, plan configurations of the word lines $123b_1$ and $123b_2$ are straight shapes. As in the first embodiment, a source diffusion region and drain diffusion regions of a transistor constituting a memory cell are formed on both sides of the word lines in each transistor region. Portions of the word lines located above each transistor region constitute gate electrodes of the transistor, and are located on the surface region of the substrate 101 via gate insulating films. The surfaces of the diffusion regions and the word lines are covered with the first and second interlayer insulating films as in the first embodiment (not shown).

The source diffusion region located inside the pair of word lines at each transistor region 120b is connected to a connecting wiring 113c in the contact hole 105b that is formed in the first and second interlayer insulating films, and the connecting wiring 113c is connected to a bit line 115 extending along the second direction perpendicular to the first direction D1, through a contact hole 105c that is formed in a third interlayer insulating film on the connecting wiring (not shown). The drain diffusion regions located outside the pair of word lines at each transistor region 120b are electrically connected to the upper electrodes 112b of the ferroelectric capacitors corresponding to each transistor region by the connecting wirings 113a. That is, one end of the connecting wiring 113a is connected to the upper electrode 112b through the contact hole 104a that is formed in the second interlayer insulating film, and the other end of the connecting wiring 113a is connected to the drain diffusion region through the contact hole 105a that is formed in the first and second interlayer insulating films.

In this case, by making the arrangement intervals between the upper electrodes 112b narrower than those in the first embodiment, the contact holes 105a on the drain diffusion regions 121 (refer to FIG. 2) and the contact hole 105b on the source diffusion region 122 (refer to FIG. 2) in each transistor region 120b are arranged on a straight line parallel to the second direction D2. The connecting wirings 113a and 113c have a double-layer structure comprising titanium and aluminum as in the first embodiment. The bit lines 115 are formed by patterning an aluminum layer or the like that is formed on the conductive layer of the double-layer structure.

The other constructions are identical as in the first embodiment, the first and second interlayer insulating films comprise the identical material as in the first embodiment, and the ferroelectric layers 113 of the ferroelectric capacitors comprise the same ferroelectric material as in the first embodiment.

In the second embodiment with the construction as described above, since the arrangement intervals between the plurality of upper electrodes 112b that are arranged in a line on the lower electrode 111a are set to be the minimum process size, the layout area that is occupied by the memory cell array can be reduced to about 60% of the layout area according to the first embodiment, in addition to the effects of the first embodiment.

Embodiment 3

Figure 6:
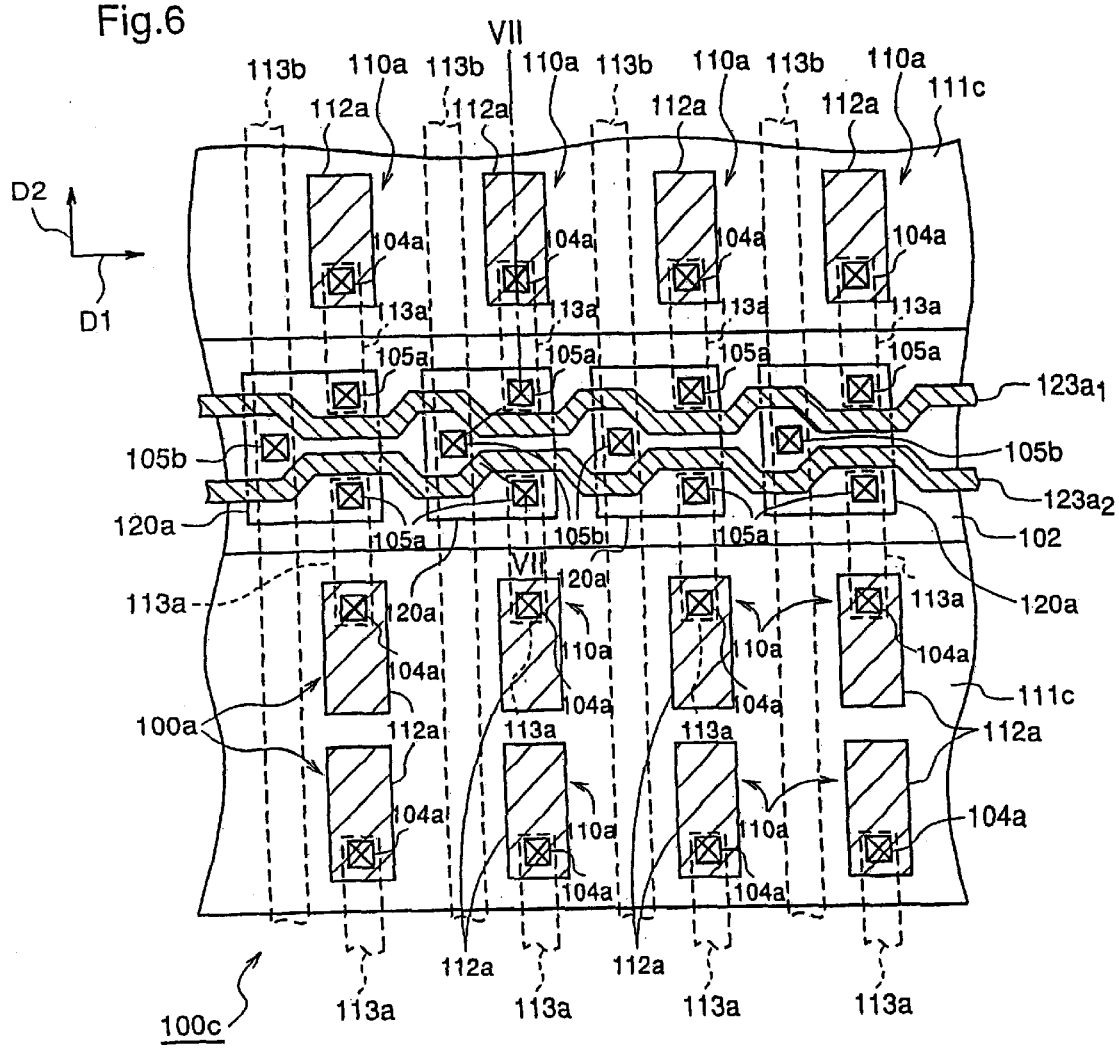
FIG. 6 is a plan view illustrating a memory cell array of a ferroelectric memory device in accordance with a third embodiment of the present invention.
Figure 7:
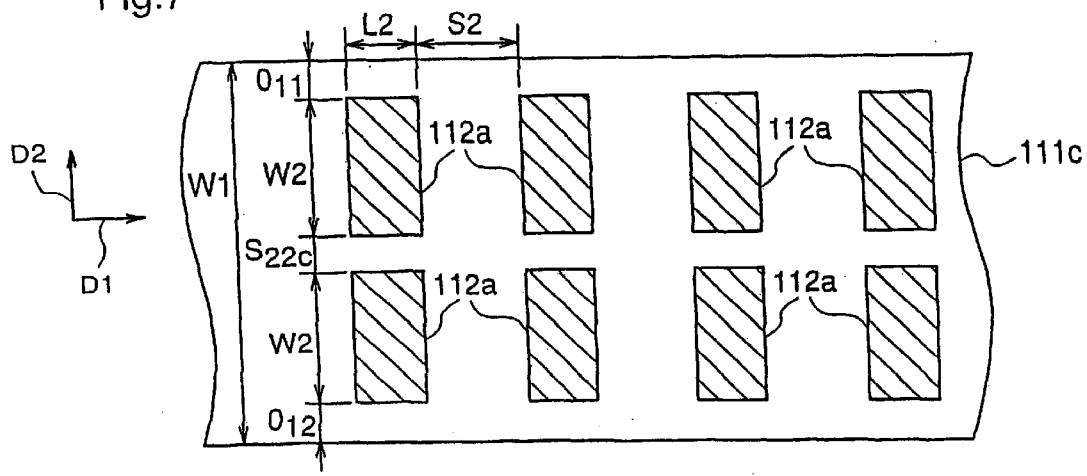
FIG. 7 is a plan view illustrating a position relation between a lower electrode and upper electrodes constituting ferroelectric capacitors according to the third embodiment of the invention.

FIGS. 6 and 7 are diagrams for explaining a ferroelectric memory device according to a third embodiment of the present invention, FIG. 6 is a plan view illustrating a memory cell array constituting the ferroelectric memory device, and FIG. 7 is a plan view illustrating a position relation between upper electrodes and a lower electrode constituting ferroelectric capacitors in the memory cell array.

In the figures, reference numeral 100c designates a memory cell array of a ferroelectric memory device according to the third embodiment, and the same reference numerals as those shown in FIGS. 1 to 3 designate the same parts as in the first embodiment.

This memory cell array 100c has lower electrodes 111c with widths $W_2$ (size in the second direction D2) that are increased as compared with those of the lower electrodes 111a, in place of the lower electrodes 111a according to the first embodiment, and the upper electrodes 112a are arranged in two lines along the first direction D1 on the lower electrodes 111c.

In this case, the arrangement intervals between the upper electrodes 112a that are arranged on the lower wiring 111c along the first direction D1 are set to be the same size $S_2$ as in the first embodiment, and the arrangement interval between the upper electrodes 112a that are arranged along the second direction is set to be the minimum process size $S_{22c}$. The other constructions are identical as in the memory cell array 100a of the first embodiment.

In the third embodiment with the construction as described above, since a plan shape of the upper electrode 112a that is disposed on the lower electrode 111c is made a shape of the size $L_2$ in a length direction being smaller than the size $W_2$ in a width direction, the width $L_2$ of a region of the upper electrode 112a that is affected by deterioration of material quality of the ferroelectric layer becomes small, whereby even when the distances $O_{11}$ and $O_{12}$ (non-overlap widths) between the sides of the lower electrode and the adjacent sides of the upper electrode are made smaller, variations in characteristics as the whole of the ferroelectric capacitors and characteristic changes can be suppressed.

Further, since the lower electrode 111c has a wide structure, and the upper electrodes 112a are arranged in two lines along the first direction D1 on the lower electrode 111c, the area of the lower electrode corresponding to two lines of the upper electrodes 112a can be reduced as compared with the area according to the first embodiment, resulting in a high-density layout on the substrate of the memory cell array.

Furthermore, in this embodiment of the invention, since the arrangement interval between the upper electrodes 112a that are arranged along the width direction on the lower electrode 111c is set to be the minimum process size $S_{22c}$, as a result, the area that is occupied on the substrate of the memory cell array can be reduced by about 10% of the area according to the first embodiment.

Embodiment 4

Figure 8:
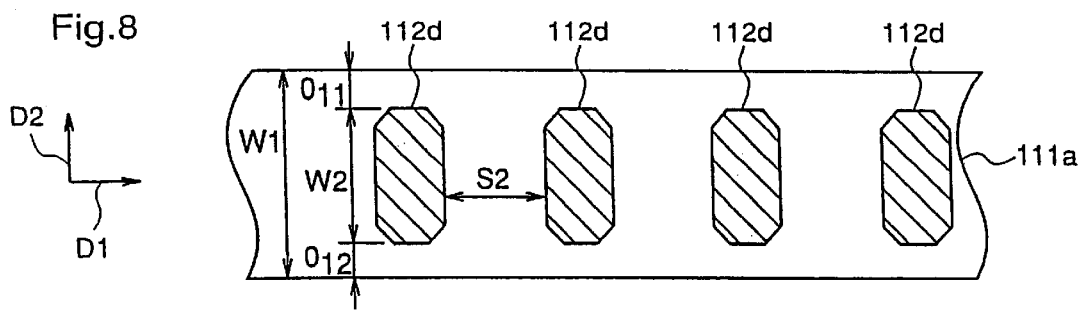
FIG. 8 is a plan view for explaining a ferroelectric memory device in accordance with a fourth embodiment of the present invention, and shows a position relation between a lower electrode and upper electrodes of ferroelectric capacitors constituting the ferroelectric memory device.

FIG. 8 is a diagram for explaining a ferroelectric memory device according to a fourth embodiment of the present invention, and shows a plan configuration of upper electrodes of ferroelectric capacitors constituting the ferroelectric memory device.

In the figure, reference numeral 112d designates an upper electrode constituting a ferroelectric capacitor according to the fourth embodiment, and the plurality of upper electrodes 112d are arranged at predetermined intervals on the lower electrode 111a along the second direction D2, as in the first embodiment. In this case, the upper electrode 112d has a plan shape that is obtained by chamfering four corners of the upper electrode 112a of a rectangular shape in the first embodiment. That is, the upper electrode 112d has an octagonal shape having the second direction D2 as its longitudinal direction, and all of interior angles are larger than 90°. The other constructions are identical as in the first embodiment.

In the fourth embodiment with such a construction, since the upper electrodes 112d have polygonal shapes in which all of the interior angles are larger than 90°, when the upper electrodes 112d are patterned, variations in the shapes at the upper electrode angle parts can be reduced, whereby occurrence of variations in characteristics of the ferroelectric capacitors and characteristic changes can be further suppressed as compared with the effects according to the first embodiment. In this case, although the areas of the upper electrodes 112d become a little smaller than those in the first embodiment, it is possible to make a reduction in area by chamfering the upper electrodes 112a of rectangular shapes hardly affect the capacitance values of the ferroelectric capacitors.

In addition, in the fourth embodiment of the invention, although there is described the case in which four corners of the upper electrode 112a are chamfered in the memory cell array according to the first embodiment, four corners of the upper electrode 112b or 112a may be chamfered in the memory cell array 100b or 110c according to the second or third embodiment, and also in this case, the same effects as in the fourth embodiment are obtained.

Embodiment 5

Figure 9:
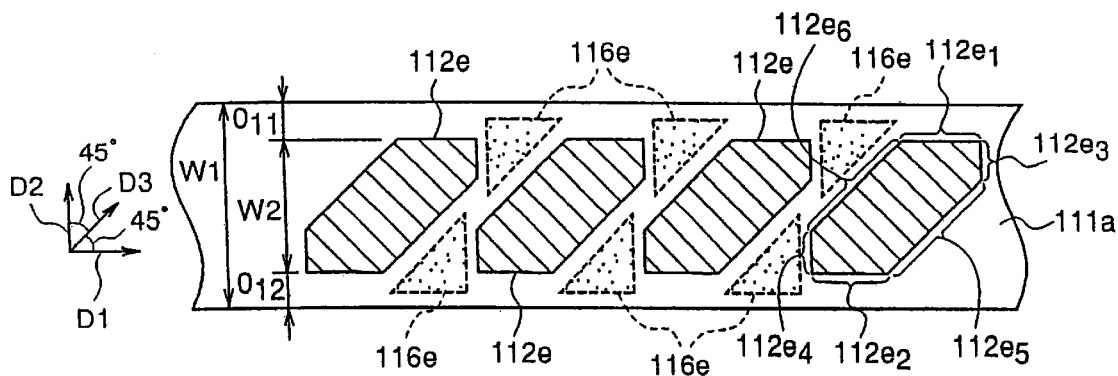
FIG. 9 is a plan view for explaining a ferroelectric memory device in accordance with a fifth embodiment of the present invention, and shows a position relation between a lower electrode and upper electrodes of ferroelectric capacitors constituting the ferroelectric memory device.

FIG. 9 is a diagram for explaining a ferroelectric memory device according to a fifth embodiment of the present invention, and shows a plan configuration of upper electrodes of ferroelectric capacitors constituting the ferroelectric memory device.

In the figure, reference numeral 112e designates an upper electrode constituting a ferroelectric capacitor according to the fifth embodiment, and the plurality of upper electrodes 112e are arranged at predetermined pitches on the lower electrode 111a extending along the first direction D1, along the second direction D2 perpendicular to the first direction D1, as in the first embodiment. In this case, the upper electrode 112e is different from the upper electrode 112a of a rectangular shape in the first embodiment, and its plan shape is a hexagonal shape having a direction D3 that forms an angle of 45° with respect to the first direction D1 as its longitudinal direction.

That is, the hexagonal shape of the upper electrode 112e is constituted by two lateral sides $112e_1$ and $112e_2$ that are parallel to the first direction D1 and opposite to each other, two longitudinal sides $112e_3$ and $112e_4$ that respectively link to the lateral sides, and are parallel to the second direction D2 and opposite to each other, an oblique side $112e_6$ that links between the longitudinal side $112e_4$ and the lateral side $112e_1$, and an oblique side $112e_5$ that links between the longitudinal side $112e_3$ and the lateral side $112e_2$. At this time, the oblique sides $112e_6$ and $112e_5$ are parallel to the third direction D3. The other constructions are identical as in the first embodiment.

In the fifth embodiment with such a construction, since the plan shape of the upper electrode 112e is a hexagonal shape having the direction D3 that forms an angle of 45° with respect to the first direction D1, i.e., a longitudinal direction of the lower electrode 111a, as its longitudinal direction, a region of the upper electrode 112e that is affected by deterioration of material quality of the ferroelectric layer at both side portions parallel to the first direction D1 can be reduced as in the first embodiment.

Further, in the fifth embodiment of the invention, since the longitudinal direction of the upper electrode 112e is the oblique direction D3 that forms an angle of 45° with respect to a width direction D2 (second direction) of the lower electrode, the length of the upper electrode 112e on the lower electrode 111a of the specified width size $W_1$ can be increased as compared with the first embodiment. As a result, in the fifth embodiment, while occurrence of variations in characteristics of the ferroelectric capacitors and characteristic changes can be suppressed, the areas of the ferroelectric capacitors can be increased to increase the capacitance values. More specifically, the capacitance values of the ferroelectric capacitors can be. increased by about 25% of the values of the ferroelectric capacitors of the first embodiment.

Furthermore, in the fifth embodiment, even when the distance between the opposite oblique sides of the adjacent upper electrodes 112e is set to be, for example, the minimum process size, vacancy regions 116e are formed at portions of the lower electrode 111a at the vicinity of both sides between the adjacent upper electrodes 112e. For example, wiring layers comprising polysilicon, semiconductor elements or the like can be disposed on the vacancy regions 116e, whereby the device area, i.e., the substrate area in the ferroelectric memory device, can be effectively utilized.

Embodiment 6

Figure 10:
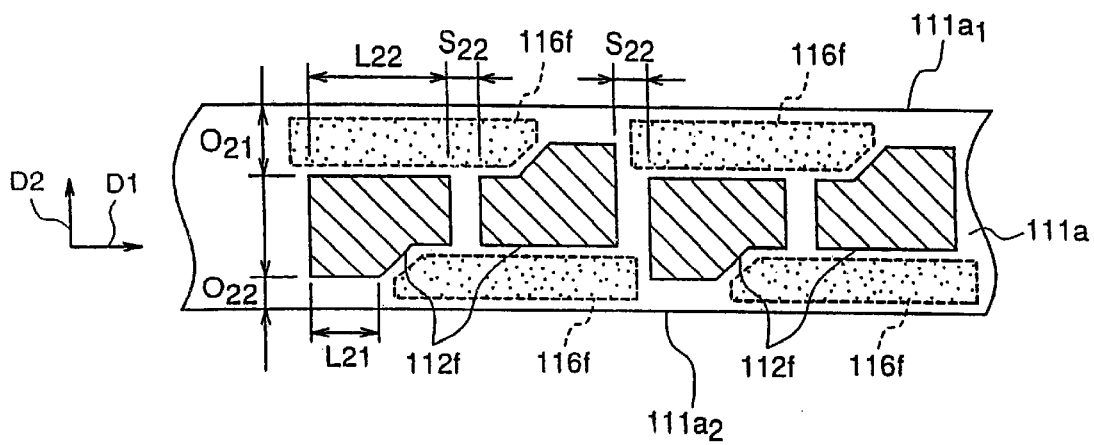
FIGS. 10(a)–10(c) are plan views for explaining a ferroelectric memory device in accordance with a sixth embodiment of the present invention, where
Figure 10:
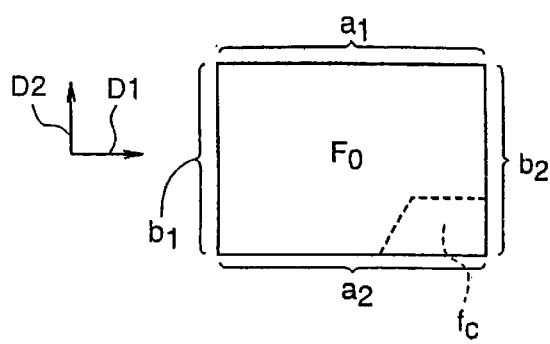
Figure 10:
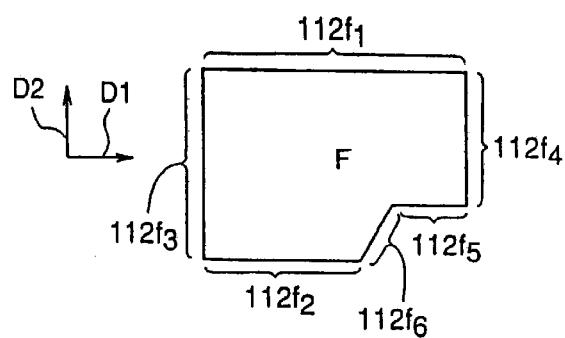

FIG. 10 is a diagram for explaining a ferroelectric memory device according to a sixth embodiment of the present invention, and shows a plan configuration of upper electrodes of ferroelectric capacitors constituting the ferroelectric memory device.

In the figure, reference numeral 112f designates an upper electrode constituting a ferroelectric capacitor according to the sixth embodiment, and the plurality of upper electrodes 112f are arranged at predetermined pitches on the lower electrode 111a along the first direction D1, as in the first embodiment. In this case, the upper electrode 112f is different from the upper electrode 112a of a rectangular shape in the first embodiment, and has a plan shape F (FIG. 10(c)) that is obtained by chipping one angle part $f_c$ of a rectangular shape $F_0$ (FIG. 10(b)) having the first direction D1 as its longitudinal direction.

That is, the hexagonal shape F of the upper electrode 112f has a laterally long side $112f_1$ and a first laterally short side $112f_2$ that are parallel to the first direction D1 and opposite to each other, and a longitudinally long side $112f_3$ and a longitudinally short side $112f_4$ that are parallel to the second direction D2 perpendicular to the first direction D1 and opposite to each other. The laterally long side $112f_1$ and the longitudinally long side $112f_3$ that link to each other at the ends agree with a lateral side $a_1$ and a longitudinal side $b_1$ of the rectangular shape $F_0$, respectively, and the ends of the laterally short side $112f_2$ and the longitudinally short side $112f_4$ link to the other ends of the laterally long side $112f_1$ and the longitudinally long side $112f_3$, respectively, and these sides are positioned on a longitudinal side $a_2$ and a lateral side $b_2$ of the rectangular shape $F_0$, respectively. Further, the shape F has a second laterally short side $112f_5$ that has one en d linking to the other end of th e longitudinally short side $112f_4$ and is parallel to the laterally long side $112f_1$, and an oblique side $112f_6$ that has one end linking to the other end of the laterally short side $112f_2$ and the other end linking to the other end of the second laterally short side $112f_5$, and that forms an interior angle of an obtuse angle with the laterally short side $112f_2$.

In the sixth embodiment of the invention, arrangements shown in FIG. 10(c) and arrangements that are obtained by making 180° revolution of the arrangements shown in FIG. 10(c) are alternatively disposed on the lower electrode 111a along the first direction D1. At this time, the second laterally short side $112f_5$ of one of the adjacent upper electrodes 112f and the laterally long side $112f_1$ of the other are positioned on the same line. Further, the distance between the longitudinal sides of the adjacent upper electrodes 112f is set to be the minimum process size $S_{22}$. The other constructions are identical as in the first embodiment.

In the sixth embodiment with such a construction, since the non-overlap width $O_{22}$, i.e., the distance between the laterally short side $112f_2$ of the upper electrode 112f and the side $111a_2$ of the lower electrode 111a, is narrowed at the laterally short side $112f_2$ of, for example, the upper electrode 112f (arrangement shown in FIG. 10(c)), close to the side $111a_2$ of the lower electrode 111a, the capacitance of the ferroelectric capacitor can be increased. In addition, since the non-overlap width $O_{21}$, i.e., the distance between the laterally long side $112f_1$ of the upper electrode $112f$ and the side $111a_1$ of the lower electrode $111a$, is widen at the laterally long side $112f_1$ of the upper electrode $112f$ (arrangement shown in FIG. 10(c)) close to the side $111a_1$ of the lower electrode $111a$, the influence by deterioration of material quality of the ferroelectric layer at the side portions, which is formed on the lower electrode $111a$, can be prevented from spreading over the ferroelectric capacitor. Consequently, while occurrence of variations in characteristics of the ferroelectric capacitors and characteristic changes can be suppressed, the areas of the ferroelectric capacitors can be increased to increase the capacitance values.

Further, in the sixth embodiment, since the ferroelectric capacitors are zigzag-arranged slightly without being arranged in a line, degree of freedom in a layout of the memory cell array, i.e., an arrangement of the memory transistors and the ferroelectric capacitors, and degree of freedom in an arrangement of the bit lines and the word lines can be improved.

Furthermore, in the sixth embodiment, as the length of the first laterally short side $112f_2$ of the upper electrode $112f$ that is positioned at the vicinity of the side of the lower electrode $111a$ is smaller, the distance between the first laterally short side $112f_2$ and the side of the lower electrode $111a$ is shortened, whereby while variations in characteristics of the ferroelectric capacitors and characteristic changes can be prevented from being easily caused, the capacitance values can be increased.

In addition, in the sixth embodiment, by chamfering four corners of the upper electrode $112f$ in which the interior angles in its plan shape are 90° to make the interior angles larger than 90°, it is possible to further reduce the characteristic variations and further make the characteristic changes difficult with affecting the capacitance values.

Also in the sixth embodiment of the invention, on each region between the lateral sides of the adjacent upper electrodes $112f$ in which the longitudinally short sides $112f_4$ are opposite to each other, and the side of the lower electrode $111a$, i.e., a vacancy region $116f$ that is sandwiched between the laterally long side $112f_1$ of one of both of the upper electrodes $112f$ and the second laterally. short side $112f_5$ of the other, and the side of the lower electrode $111a$, for example, a wiring layer comprising polysilicon, a semiconductor element or the like can be disposed, whereby the device area can be effectively utilized.

Figure 11:
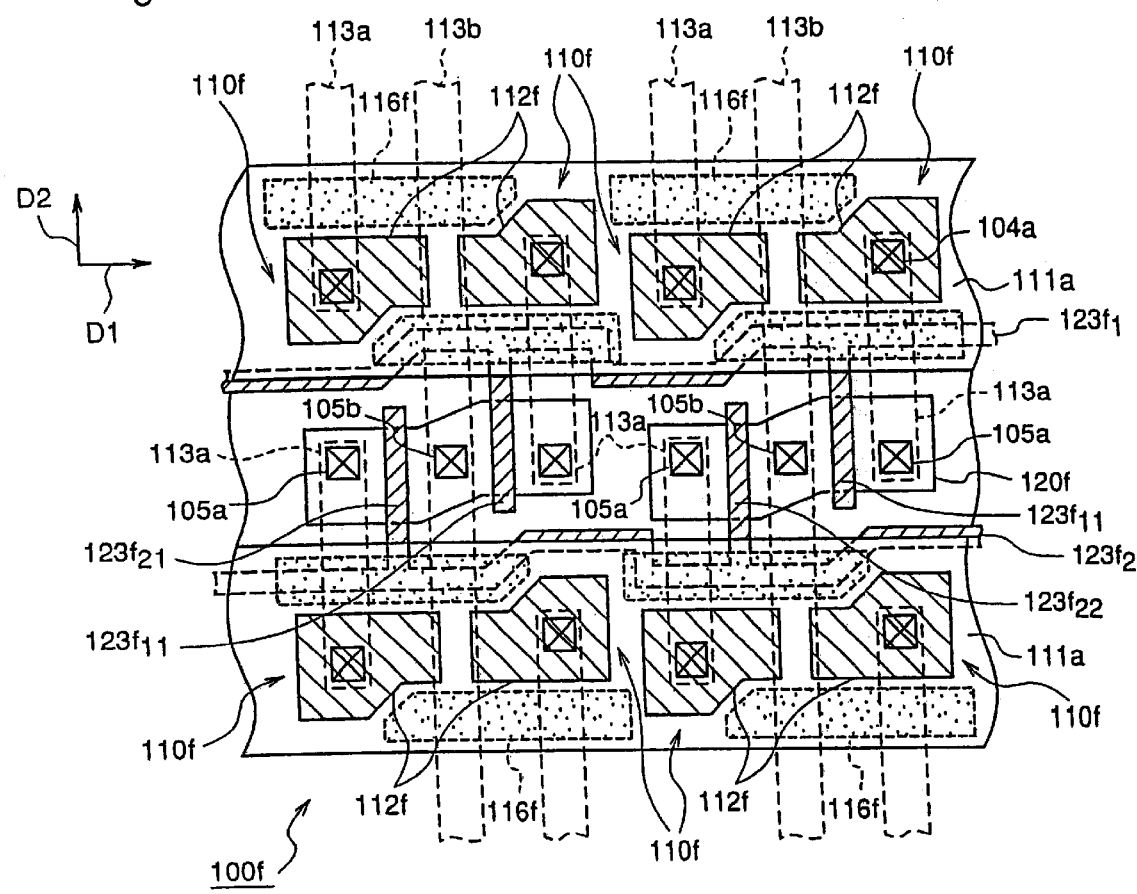
FIG. 11 is a plan view illustrating a construction of a memory cell array using the structure of the upper electrode of the ferroelectric capacitor according to the sixth embodiment and effectively utilizing the device area.

FIG. 11 illustrates a construction of a memory cell array $100f$ in which the vacancy regions $116f$ are effectively utilized as arrangement regions of polysilicon layers constituting word lines.

In this memory cell array $100f$, transistor regions $120f$ have a laterally long shape having the first direction D1 as its longitudinal direction, and contact holes $105a$ on drain diffusion regions and a contact hole $105b$ on a source diffusion region in each transistor region $120f$ are arranged in a line parallel to the first direction D1. On both sides of the transistor regions $120f$ arranged along the first direction D1, a pair of word lines $123f_1$ and $123f_2$ is disposed along the first direction D1. The word lines $123f_1$ and $123f_2$ have gate portions $123f_{11}$ and $123f_{22}$ constituting gate electrodes that are located between the source and drain diffusion regions of each transistor region $120f$. These gate portions $123f_{11}$ and $123f_{22}$ are formed unitedly with the word lines, and the connection portions of the word lines and the gate portions and the surrounding portions are disposed just below the vacancy regions $116f$ of the lower wirings $111a$.

Usually, it is necessary that portions of the lower electrode $111a$ at which the ferroelectric capacitors are constituted be even, and no other constitutional materials can be disposed under these portions, but in the sixth embodiment, since the vacancy regions $116f$ are formed at portions of the lower electrode $111a$, except for the portions just below the upper electrodes $112f$, for example, the parts of the word lines $123f_1$ and $123f_2$ can be disposed under the vacancy regions $116f$, whereby the device area, i.e., the area on the substrate that is occupied by the memory cell array, can be effectively utilized.

In addition to the first to sixth embodiments described above, constructions of memory cell arrays that are obtained by combining these embodiments can be realized.

In addition, although in the embodiments described above, there are described the memory cell arrays constituting ferroelectric memory devices as structures of ferroelectric capacitors, the ferroelectric capacitor structures described for the respective embodiments can be applied to circuits except a memory cell array.

Embodiment 7

Figure 12:
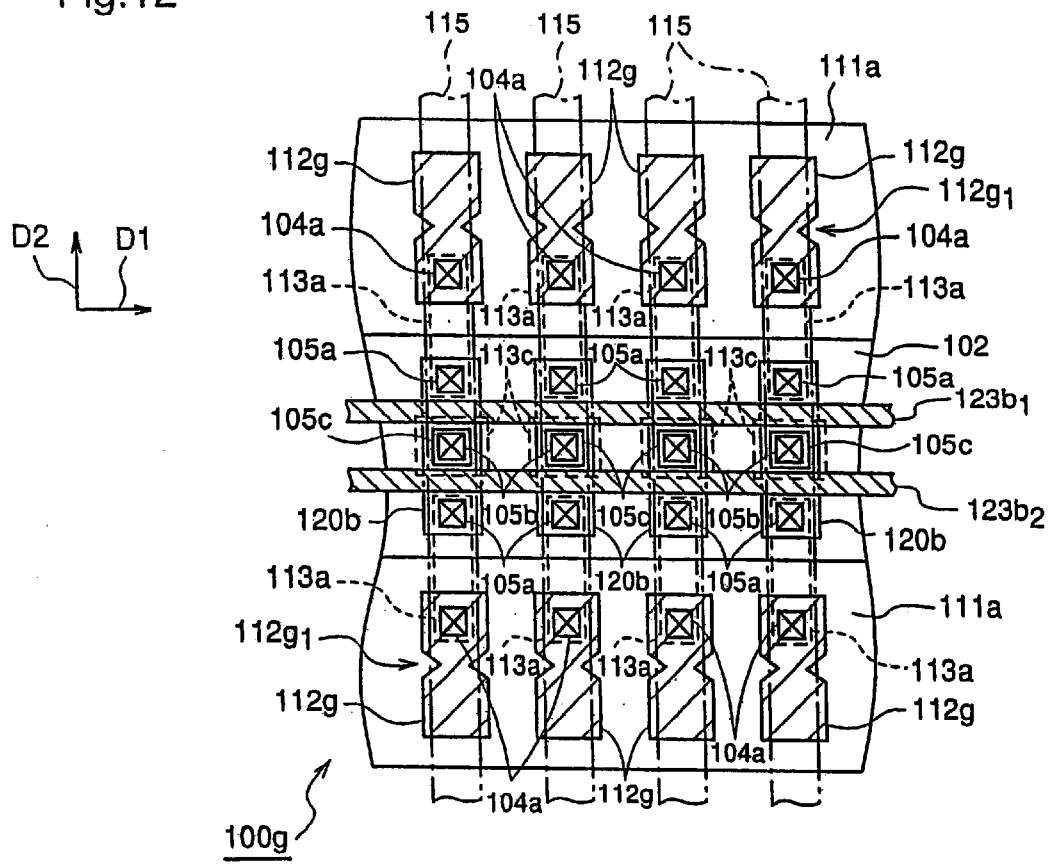
FIG. 12 is a plan view illustrating a memory cell array of a ferroelectric memory device in accordance with a seventh embodiment of the present invention.
Figure 13:
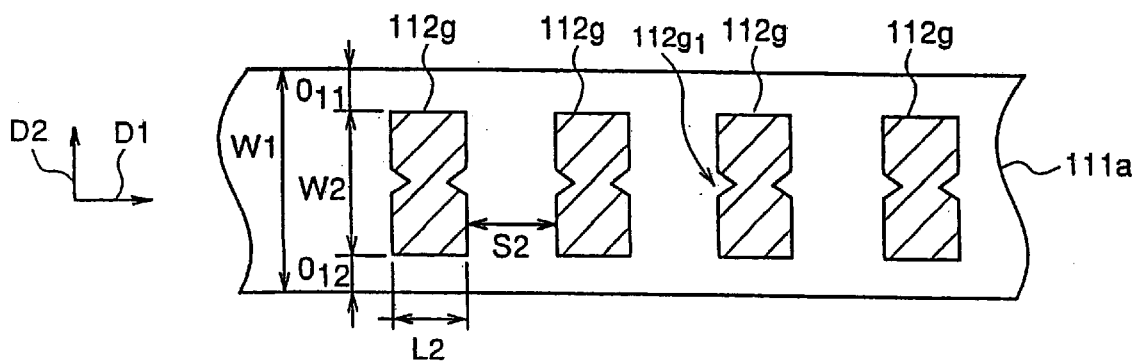
FIG. 13 is a plan view illustrating a position relation between a lower electrode and upper electrodes constituting ferroelectric capacitors according to the seventh embodiment of the invention.
Figure 14:
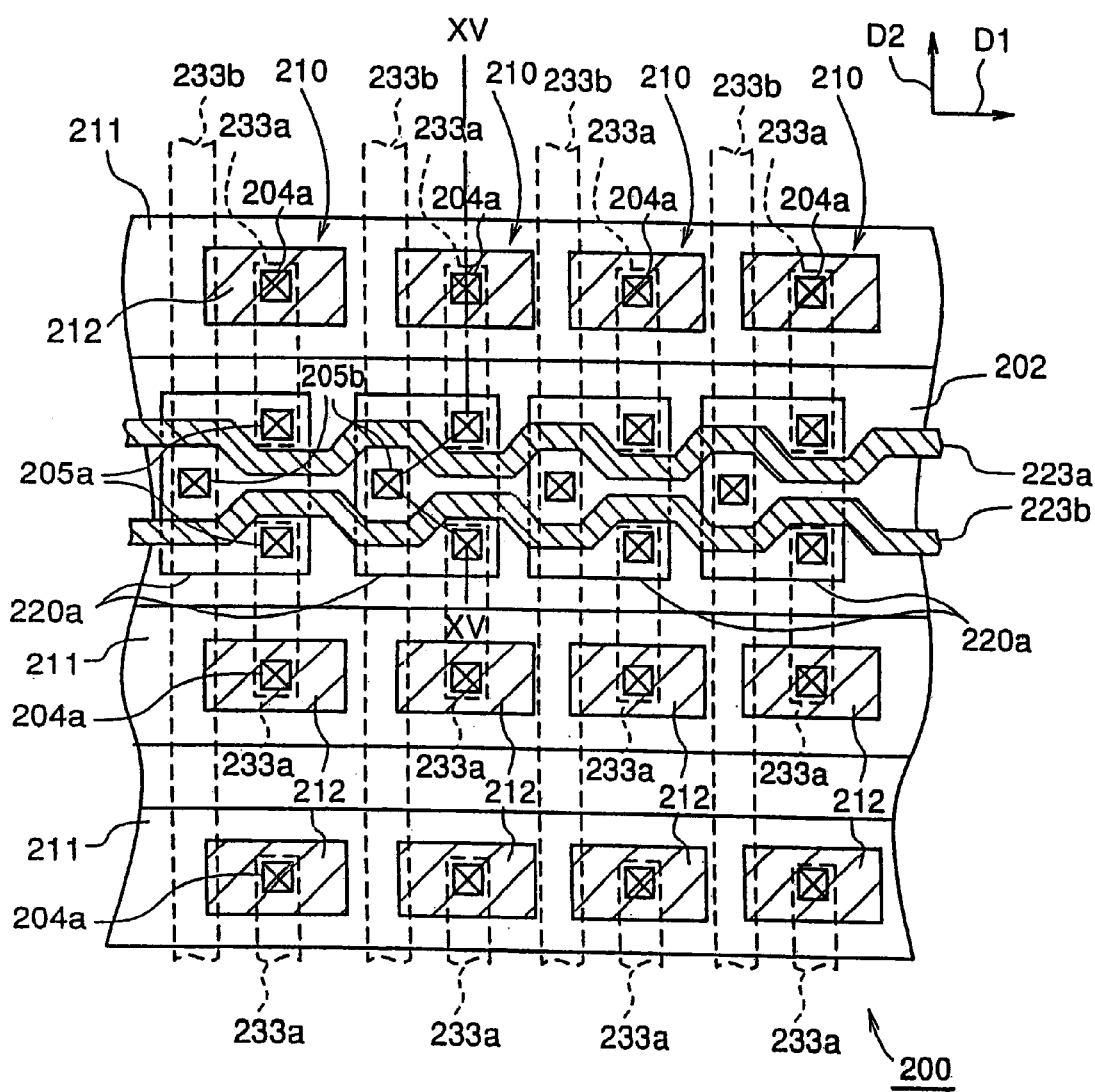
FIG. 14 is a plan view illustrating a memory cell array of a conventional ferroelectric memory device.
Figure 15:
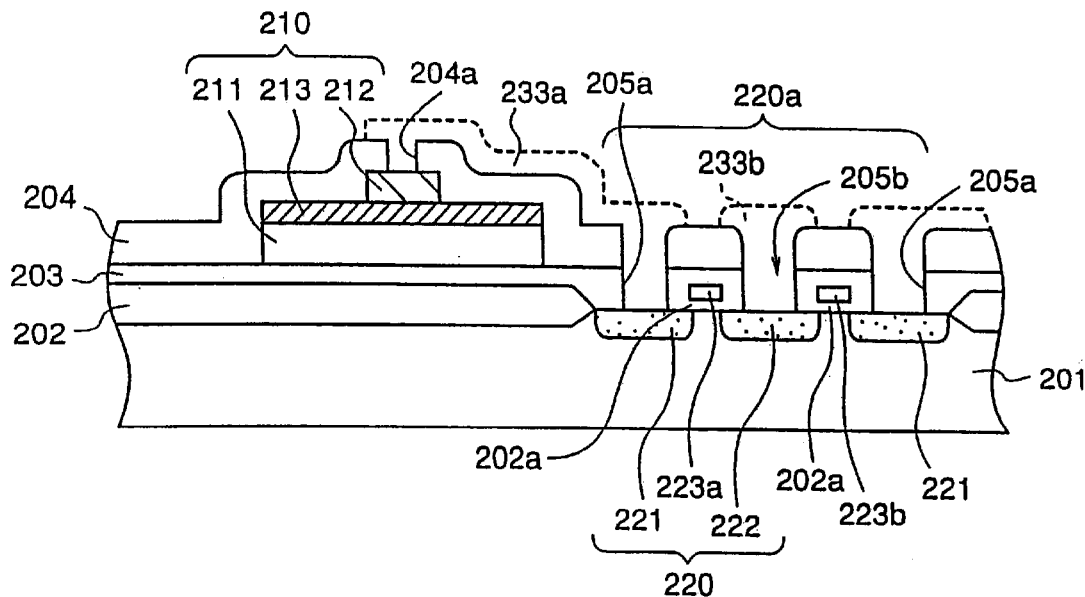
FIG. 15 is a cross-sectional view along a line XV—XV portion in FIG. 14.

FIGS. 12 and 13 are diagrams for explaining a ferroelectric memory device according to a seventh embodiment of the present invention, FIG. 12 is a plan view illustrating a memory cell array constituting the ferroelectric memory device, and FIG. 13 is a plan view illustrating a position relation between upper electrodes and a lower electrode constituting ferroelectric capacitors in the memory cell array.

In the figures, reference numeral $100g$ designates a memory cell array constituting a ferroelectric memory device according to the seventh embodiment. In this memory cell array $100g$, a plan shape of each upper electrode $112g$ is a shape that is obtained by forming notches $112g_1$ at the center portions of both sides along the second direction D2 of the upper electrode $112b$ in the second embodiment, and the other constructions are identical as in the second embodiment.

In the seventh embodiment with such a construction, the notches $112g_1$ can prevent deterioration of material quality of the ferroelectric layer due to diffusion of impurities from the contact holes $104a$ that are formed on the upper electrodes $112a$ from spreading over portions corresponding to the center of the upper electrodes $112a$, to some degree. That is, regions of the ferroelectric layer at which deterioration of material quality is caused by diffusion of impurities from the contact holes $104a$ can be prevented from spreading over the center portions of the upper electrodes $112b$, thereby keeping wide regions of the ferroelectric layer at which no deterioration of material quality is caused. Consequently, variations in characteristics as the ferroelectric capacitors and characteristic deterioration can be effectively suppressed.

INDUSTRIAL AVAILABILITY

As described above, a semiconductor device according to the present invention (claim 1) includes a first electrode of a stripe-shaped plan configuration having a first direction as its longitudinal direction and a second direction perpendicular to the first direction as its width direction, and second electrodes are disposed on the first electrode via a ferroelectric layer, thereby constituting ferroelectric capacitors, a plan configuration of the second electrode being a plan configuration of the size in the first direction and the size in the second direction being equal to each other, or a plan configuration of the size in the first direction being shorter than the size in the second direction, so that the ratio of regions of the second electrodes that are positioned along sides of the first electrode to the whole of the second electrodes is reduced, whereby the ferroelectric capacitors become structures that are hardly affected by deterioration of material quality of the ferroelectric layer at regions corresponding to the sides of the first electrode. As a result, variations in characteristics of the ferroelectric capacitors can be suppressed and characteristic changes are hardly caused.

In addition, in this case, without reducing the areas of the second electrodes, the distances between the sides of the first electrode and the sides of the second electrodes adjacent to the sides of the first electrode, respectively, can be shortened, whereby the layout area of a memory cell array can be reduced without decreasing the capacitances of the ferroelectric capacitors.

In a preferred semiconductor device according to the present invention, the plurality of second electrodes are arranged along the first direction, opposite to the first electrode, and the arrangement intervals between the adjacent second electrodes are set to be the process minimum size of an opening pattern of a conductive material layer constituting the second electrodes, so that the layout area of a memory cell array on which the plurality of ferroelectric capacitors are located can be reduced.

In a preferred semiconductor device according to the present invention, a plan configuration of the second electrode is a polygonal configuration, and all the sizes of respective interior angles in the plan configuration of the second electrode are larger than 90°, so that it is possible to perform processing of the second electrodes with better reproducibility, whereby the variations in characteristics of the ferroelectric capacitors and the characteristic changes can be further suppressed.

A preferred semiconductor device according to the present invention includes first electrodes of a stripe-shaped plan configuration having a first direction as its longitudinal direction and a second direction perpendicular to the first direction as its width direction, and a plurality of second electrodes are disposed on the first electrodes via ferroelectric layers, thereby constituting a plurality of ferroelectric capacitors, the plurality of second electrodes on the first electrodes being disposed in the form of a matrix in which the second electrodes are arranged lengthwise and breadthwise, so that the number of ferroelectric capacitors per unit area on a memory cell array is increased, resulting in a high-density layout on a substrate of the memory cell array.

In a preferred semiconductor device according to the present invention, the plurality of second electrodes are arranged along the first direction, opposite to the first electrodes, and the arrangement intervals between the adjacent second electrodes are set to be the process minimum size of an opening pattern of a conductive material layer constituting the second electrodes, so that the layout area of the memory cell array on which the plurality of ferroelectric capacitors are located can be reduced.

A preferred semiconductor device according to the present invention includes a first electrode of a stripe-shaped plan configuration having a first direction as its longitudinal direction and a second direction perpendicular to the first direction as its width direction, and second electrodes are disposed on the first electrode via a ferroelectric layer, thereby constituting ferroelectric capacitors, a plan configuration of the second electrode being a plan configuration having a direction between the first direction and the second direction as its longitudinal direction, so that the ratio of regions of the second electrodes that are positioned along sides of the first electrode to the whole of the second electrodes is reduced, whereby the ferroelectric capacitors become structures that are hardly affected by deterioration of material quality of the ferroelectric layer at regions corresponding to the sides of the first electrode. As a result, variations in characteristics of the ferroelectric capacitors can be suppressed and characteristic changes are hardly caused.

In addition, in this case, without reducing the areas of the second electrodes, the distances between the sides of the first electrode and the sides of the second electrodes adjacent to the sides of the first electrode, respectively, can be shortened, whereby the layout area of a memory cell array can be reduced without decreasing the capacitances of the ferroelectric capacitors.

In a preferred semiconductor device according to the present invention, a plan configuration of the second electrode is a polygonal configuration, and all the sizes of respective interior angles in the plan configuration of the second electrode are larger than 90°, so that it is possible to perform processing of the second electrodes with better reproducibility, whereby the variations in characteristics of the ferroelectric capacitors and the characteristic changes can be further suppressed.

A preferred semiconductor device according to the present invention includes a first electrode of a stripe-shaped plan configuration having a first direction as its longitudinal direction and a second direction perpendicular to the first direction as its width direction, and second electrodes are disposed on the first electrode via a ferroelectric layer, thereby constituting ferroelectric capacitors, a length of a first side of the second electrode that is closest and opposite to a first side of the first electrode parallel to the first direction being larger than a length of a second side of the second electrode that is closest and opposite to a second side of the first electrode parallel to the first direction, and the distance between the first side of the second electrode and the first side of the first electrode being longer than the distance between the second side of the second electrode and the second side of the first electrode, so that the longer one of the first and second sides of the second electrode is distant from the side of the first electrode, whereby the ferroelectric capacitors are hardly affected by deterioration of material quality of the ferroelectric layer at regions corresponding to the sides of the first electrode. Further, the shorter one of the first and second sides of the second electrode is close to the side of the first electrode, whereby the capacitances of the ferroelectric capacitors are increased. As a result, while variations in characteristics of the ferroelectric capacitors and characteristic changes can be suppressed, the areas of the ferroelectric capacitors can be increased to increase the capacitance values.

In addition, in the present invention, the ferroelectric capacitors are easily zigzag-arranged, whereby degree of freedom in a layout of a memory cell array, i.e., an arrangement of the memory transistors and the ferroelectric capacitors, and degree of freedom in an arrangement of bit lines and word lines can be simply improved.

In a preferred semiconductor device according to the present invention, a plan configuration of the second electrode is a polygonal configuration, and all the sizes of respective interior angles in the plan configuration of the second electrode are larger than 90°, so that it is possible to perform processing of the second electrodes with better reproducibility, whereby the variations in characteristics of the ferroelectric capacitors and the characteristic changes can be further suppressed.

A preferred semiconductor device according to the present invention has a plurality of memory cells respectively comprising ferroelectric capacitors and memory transistors, a plurality of bit lines, a plurality of word lines, and sense amplifiers, and includes first electrodes of a stripe-shaped plan configuration having a first direction as its longitudinal direction and a second direction perpendicular to the first direction as its width direction, and second electrodes are disposed on the first electrodes via ferroelectric layers, thereby constituting the ferroelectric capacitors, a plan configuration of the second electrode being a plan configuration of the size in the first direction and the size in the second direction being equal to each other, or a plan configuration of the size in the first direction being shorter than the size in the second direction, so that the ratio of regions of the second electrodes that are positioned along sides of the first electrodes to the whole of the second electrodes is reduced, whereby the ferroelectric capacitors become structures that are hardly affected by deterioration of material quality of the ferroelectric layers at regions corresponding to the sides of the first electrodes. As a result, variations in characteristics of the ferroelectric capacitors can be suppressed and characteristic changes can be hardly caused.

In addition, in this case, without reducing the areas of the second electrodes, the distances between the sides of the first electrodes and the sides of the second electrodes adjacent to the sides of the first electrode, respectively, can be shortened, whereby the layout area of the memory cell array can be reduced without decreasing the capacitances of the ferroelectric capacitors.

A preferred semiconductor device according to the present invention includes a first electrode of a stripe-shaped plan configuration having a first direction as its longitudinal direction and a second direction perpendicular to the first direction as its width direction, second electrodes are disposed on the first electrode via a ferroelectric layer, thereby constituting ferroelectric capacitors, and contact holes are formed in positions of an insulating film covering the surfaces of the second electrodes that are shifted from the center positions of the second electrodes to one side of the first electrode along the first direction, so that regions of the ferroelectric layer at which deterioration of material quality is caused by diffusion of impurities from the contact holes can overlap with regions at the sides of the first electrode at which deterioration of material quality is caused, thereby keeping wide regions of the ferroelectric layer at which no deterioration of material quality is caused. Consequently, variations in characteristics of the ferroelectric capacitors and characteristic deterioration can be effectively suppressed.

A preferred semiconductor device according to the present invention includes a first electrode of a stripe-shaped plan configuration having a first direction as its longitudinal direction and a second direction perpendicular to the first direction as its width direction, second electrodes are disposed on the first electrode via a ferroelectric layer, thereby constituting ferroelectric capacitors, the second electrodes having a structure in which the whole is divided into plural electrode portions by forming notches at predetermined sides, and wirings are connected to parts of the plural electrode portions through contact holes, so that the notches can prevent deterioration of material quality of the ferroelectric layer due to diffusion of impurities from the contact holes that are formed on the second electrodes from spreading over a wide range, to some degree. More specifically, wide regions of the ferroelectric layer at which no deterioration of material quality is caused can be kept. Consequently, variations in characteristics of the ferroelectric capacitors and characteristic deterioration can be effectively suppressed.

What is claimed is:

1. A semiconductor device comprising:
    a silicon substrate;
    an insulating film formed on the silicon substrate;
    first lower electrodes disposed on the insulating film, the first lower electrodes extending along a first direction and having a stripe shaped plan configuration having a size in the first direction being longer than that in a second direction perpendicular to the first direction as its width direction;
    a plurality of second upper electrodes disposed on the first electrodes positioned opposite thereto and arranged in the form of a matrix along the first direction and the second direction;
    ferroelectric layers disposed between the first electrodes and the second electrodes the plurality of second electrodes being respectively electrically independent, and the plurality of second electrodes, the first electrodes and the ferroelectric layer therebetween a plurality of ferroelectric capacitors, each of said second electrodes having a contact hole disposed along a surface thereof, said contact hole being shifted from the center of said surface to one side along the first direction of the first electrode.

2. The semiconductor device as defined in claim 1 wherein the second electrodes have a plan configuration of the size in the first direction and the size in the second direction being equal to each other, or a plan configuration of the size in the first direction being shorter than the size in the second direction.

* * * * *